United States Patent
Goto et al.

(10) Patent No.: US 7,982,365 B2
(45) Date of Patent: Jul. 19, 2011

(54) ELASTIC WAVE DEVICE AND FILTER AND ELECTRONIC EQUIPMENT USING THE DEVICE

(75) Inventors: Rei Goto, Osaka (JP); Hidekazu Nakanishi, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 86 days.

(21) Appl. No.: 12/428,591

(22) Filed: Apr. 23, 2009

(65) Prior Publication Data
US 2009/0267449 A1    Oct. 29, 2009

(30) Foreign Application Priority Data
Apr. 28, 2008  (JP) .................. 2008-116807

(51) Int. Cl.
*H01L 41/08* (2006.01)

(52) U.S. Cl. ................................. 310/313 R

(58) Field of Classification Search .......... 333/193–195, 333/133, 196; 310/363, 364, 313 A, 313 R, 310/313 B; *H01I 41/08, 41/09*
See application file for complete search history.

(56) References Cited

U.S. PATENT DOCUMENTS

| | | | | |
|---|---|---|---|---|
| 7,692,515 B2 * | 4/2010 | Hauser et al. | ................. | 333/133 |
| 2006/0290233 A1 * | 12/2006 | Nishiyama et al. | ........ | 310/313 R |
| 2007/0210676 A1 * | 9/2007 | Matsuda et al. | .............. | 310/326 |
| 2009/0115287 A1 * | 5/2009 | Kando | ...................... | 310/313 A |
| 2009/0212659 A1 * | 8/2009 | Matsuda et al. | .......... | 310/313 D |

FOREIGN PATENT DOCUMENTS
WO    2005/069486    7/2005
* cited by examiner

*Primary Examiner* — Walt Benson
*Assistant Examiner* — Karen Addison
(74) *Attorney, Agent, or Firm* — Wenderoth, Lind & Ponack, L.L.P.

(57) ABSTRACT

The elastic wave device of the present invention has an piezoelectric substrate; a first dielectric layer disposed on the piezoelectric substrate; a second dielectric layer disposed on the first dielectric layer; and an acoustical layer on the second dielectric layer. Determining each film thickness of the first and the second dielectric layers provides advantageous effects. That is, energy of an SH wave as a main wave is confined in the boundary between the piezoelectric substrate and the first dielectric layer, and at the same time, an SV wave is suppressed as an unwanted wave. The device allows the SV wave—whose displacement distribution is similar to that of Stoneley wave—to have displacement distribution on the upper surface of the second dielectric layer and to be suppressed by the acoustical layer disposed on the second dielectric layer.

5 Claims, 11 Drawing Sheets

ELASTIC WAVE DEVICE AND FILTER AND ELECTRONIC EQUIPMENT USING THE DEVICE

FIELD OF THE INVENTION

The present invention relates to an elastic wave device and also relates to a filter and electronic equipment using the device.

BACKGROUND ART

According to some suggestions that have been made on an elastic boundary wave device, the device has a typical structure as follows: dielectric material is laminated on a surface of a piezoelectric substrate; an interdigital transducer (IDT) and a reflector, which serve as electrodes, are disposed at the boundary between the piezoelectric substrate and the dielectric material; and an acoustical layer is formed on the upper surface of the dielectric material so that an extraneous response in a higher-order mode is suppressed. A conventional elastic boundary wave device shown in FIG. 21 has piezoelectric substrate 21 as a first medium layer, dielectric film 22 as a second medium layer, Au-film 23 as an IDT electrode, and acoustical layer 24. The technique above is disclosed in the pamphlet of International Publication No. 2005/069486.

In the conventional substrate configuration, disposing acoustical layer 24 is effective in suppressing an extraneous response in a higher-order mode. However, the dielectric material of acoustical layer 24 has a substantial thickness of approx. 1λ. The thickness has been an obstacle to suppressing unwanted waves that propagate through the boundary between piezoelectric substrate 21 and dielectric film 22.

SUMMARY OF THE INVENTION

The elastic wave device of the present invention has a structure where a plurality of dielectric layers formed of different materials are laminated on the upper surface of the piezoelectric substrate and over which, an acoustical layer is disposed. According to the structure above, a properly determined film thickness of the dielectric layers allows an unwanted wave to be selectively suppressed.

The present invention provides an elastic boundary wave device, a filter and electronic equipment capable of suppressing Stoneley waves that appear in the periphery of the frequency of an elastic boundary wave used for the elastic boundary wave device.

DETAILED DESCRIPTION OF THE INVENTION

First Embodiment

The elastic wave device of the embodiment of the present invention is described hereinafter with reference to the accompanying drawings.

Figure 1:
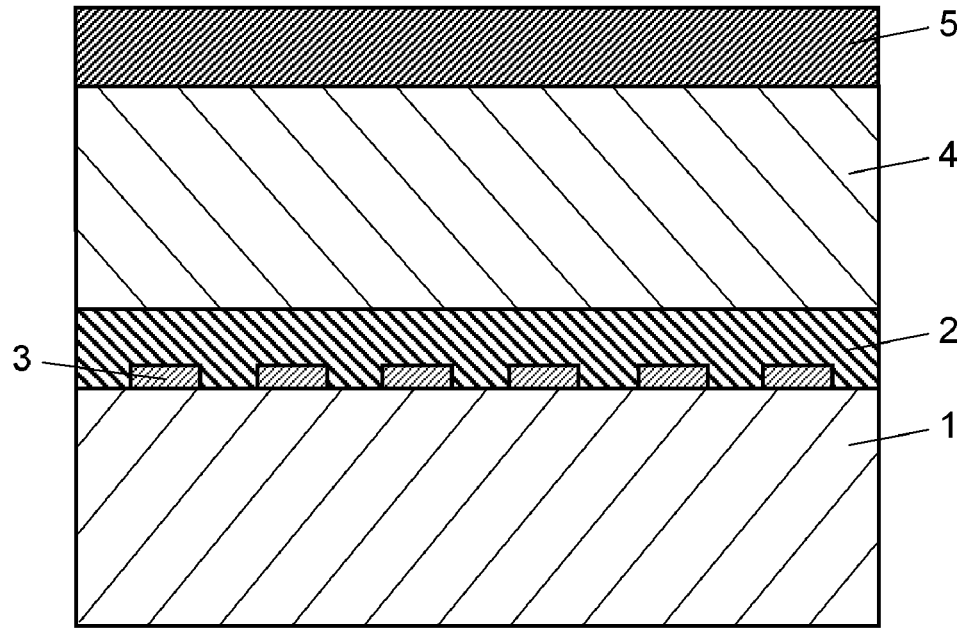
FIG. 1 is a sectional view of an elastic wave device in accordance with a first exemplary embodiment of the present invention.

FIG. 1 is a sectional view of the elastic wave device of the first exemplary embodiment. The elastic wave device of FIG. 1 contains piezoelectric substrate 1 made of LiNbO$_3$; first dielectric layer 2 disposed on the upper surface of piezoelectric substrate 1; IDT electrode 3 disposed at the boundary between piezoelectric substrate 1 and first dielectric layer 2; second dielectric layer 4 disposed on the upper surface of first dielectric layer 2; and acoustical layer 5 disposed on the upper surface of second dielectric layer 4. Acoustical layer 5 consists of silicon resin, for example.

Piezoelectric substrate 1 is a Y-cut LiNbO$_3$ substrate with a cut angle ranging from −10 degrees to +30 degrees in which an elastic wave propagates in the X-axis direction or in a direction having a range of ±5 degrees with respect to the X-axis. First dielectric layer 2 is made of silicon oxide. Second dielectric layer 4 is made of silicon nitride or aluminum nitride. IDT electrode 3 is made of Cu having a relatively high density and less conductor loss for improvement in confinement effect of an elastic wave.

According to the structure of the first exemplary embodiment, an SH wave and an SV wave propagate through the boundary of piezoelectric substrate 1 and dielectric layer 2. The SH wave mainly has a horizontal-wave component and the energy of the SH wave is confined in the boundary between piezoelectric substrate 1 and first dielectric layer 2; on the other hand, the SV wave has a component in the direction of the substrate depth and a component in the direction of the elastic-wave propagation. The SV wave exhibits a displacement distribution similar to that of the Stoneley wave. The SH wave has a high value of k2 (i.e., the coupling coefficient of an elastic wave), being applicable to devices, such as a filter and a duplexer. In a case where a device mainly employs the SH wave, the SV wave is generally detected as an unwanted wave. When the device works as an elastic wave device, it becomes necessary to suppress the SV wave as the unwanted wave.

In general, it is preferable that an elastic wave device have a low amount of propagation attenuation. To reduce the amount of propagation attenuation, elastic-wave confinement has to be increased. Specifically, the SH wave can be confined in piezoelectric substrate 1 and first dielectric layer 2, provided that the SH wave travels not only slower than the acoustic velocity of horizontal waves that slowly travel through piezoelectric substrate 1 but also slower than the acoustic velocity of horizontal waves that travel through second dielectric layer 4. Considering this, second dielectric layer 4 should preferably be made of a material that provides higher acoustic velocity of horizontal waves, such as silicon nitride or aluminum nitride. On the other hand, IDT electrode 3 should preferably be made of Cu for the reason that Cu, having a high density, allows the SH wave to have an acoustic velocity sufficiently lower than that of the horizontal wave slowly traveling through piezoelectric substrate 1.

Figure 2:
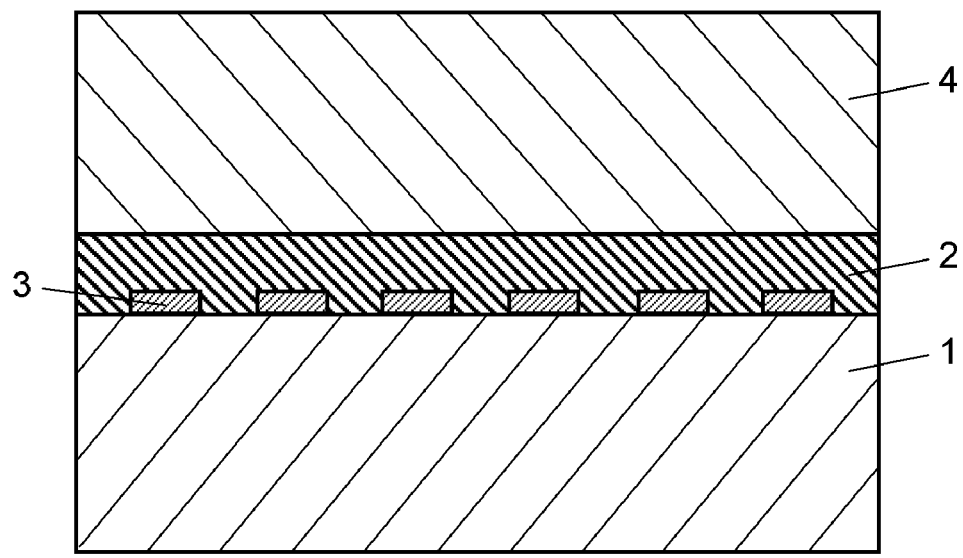
FIG. 2 is a sectional view of a general elastic wave device.
Figure 3:
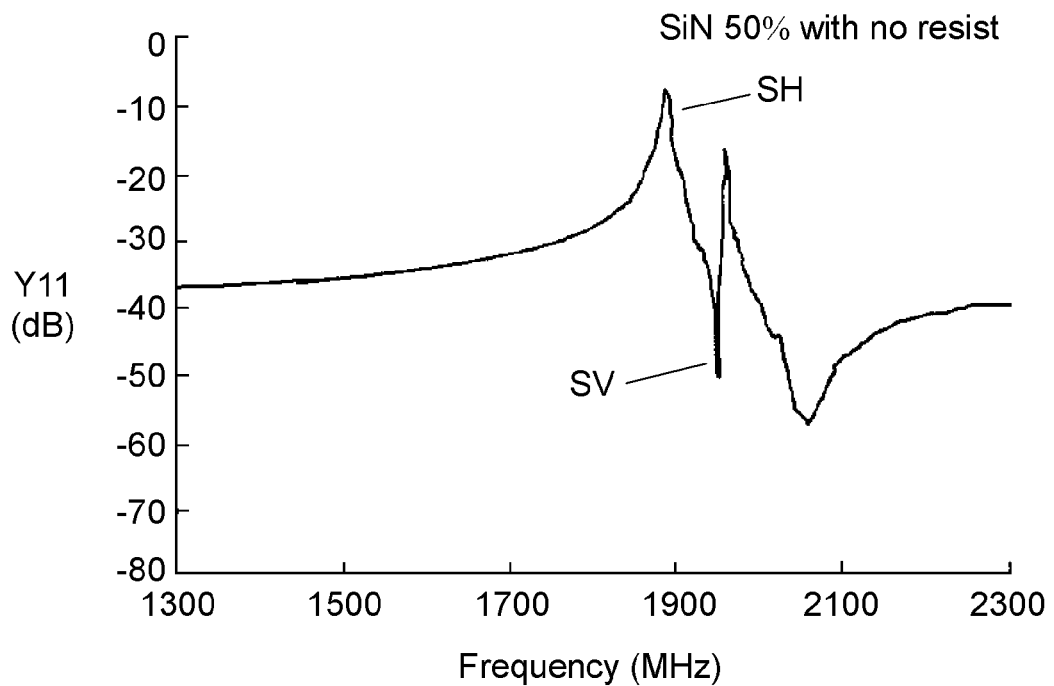
FIG. 3 is a graph showing admittance characteristics of a resonator of a general elastic wave device.

FIG. 2 is a sectional view of a general elastic wave device. FIG. 3 is a graph showing admittance characteristics of a resonator of a general elastic wave device. In the structure shown in FIGS. 2 and 3, the resonator has an IDT electrode and reflector electrodes on the both sides of the IDT electrode. First dielectric layer 2 is made of silicon oxide and second dielectric layer 4 is made of silicon nitride. Besides, the structure is so formed that the following equations are satisfied: H1/λ=0.2, H2/λ=0.5 (where, H1 represents film thickness of first dielectric layer 2; H2 represents film thickness of second dielectric layer 4; and λ represents wavelength at an operation center frequency of an elastic wave). Formed of Cu, IDT electrode 3 has a structure that satisfies the equation: h/λ=0.076 (where, h represents film thickness of IDT electrode 3). As is shown in FIG. 3, the SV wave as an extraneous response appears in the periphery of the SH wave as a main wave.

Figure 4:
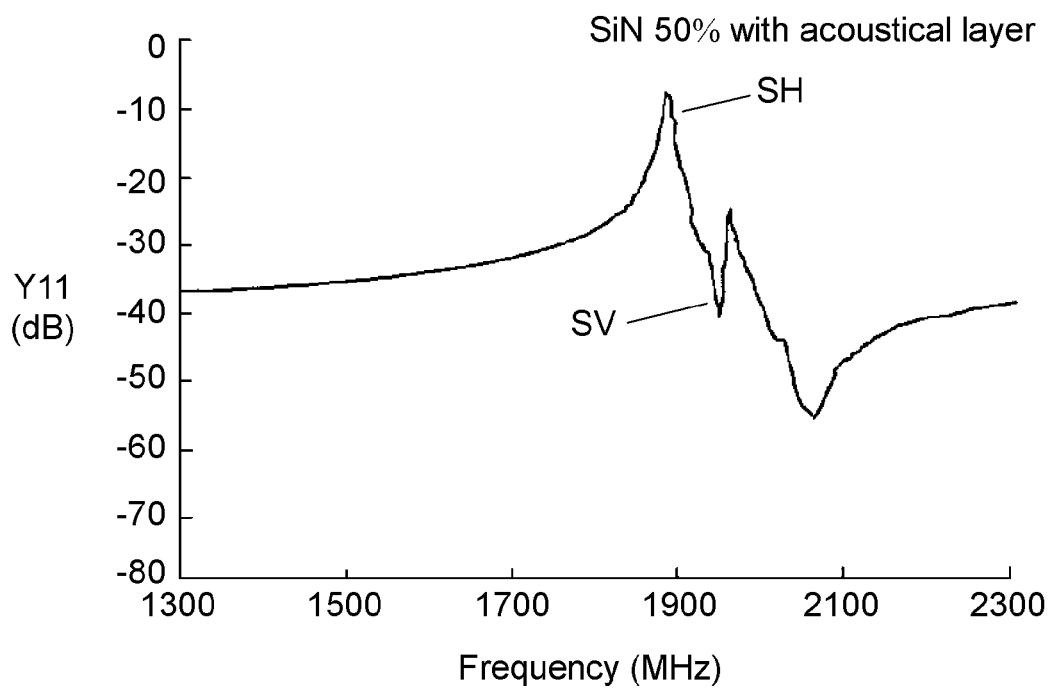
FIG. 4 is a graph showing admittance characteristics of a resonator of an elastic wave device in accordance with the first exemplary embodiment.

FIG. 4 is a graph showing admittance characteristics of a resonator of an elastic wave device in accordance with the first exemplary embodiment. In the structure having the characteristics shown in FIG. 4, the resonator has IDT electrode 3 and reflector electrodes on the both sides of IDT electrode 3. As is apparent from FIG. 4, the extraneous response of the SV wave is suppressed.

The inventor carried out numeric calculation on displacement distribution of the SH wave and the SV wave when first dielectric layer 2 and second dielectric layer 4 have a different thickness, using the analysis approach by Campbel et al. and the material constant of LiNbO$_3$ by Smith et al.

Figure 5:
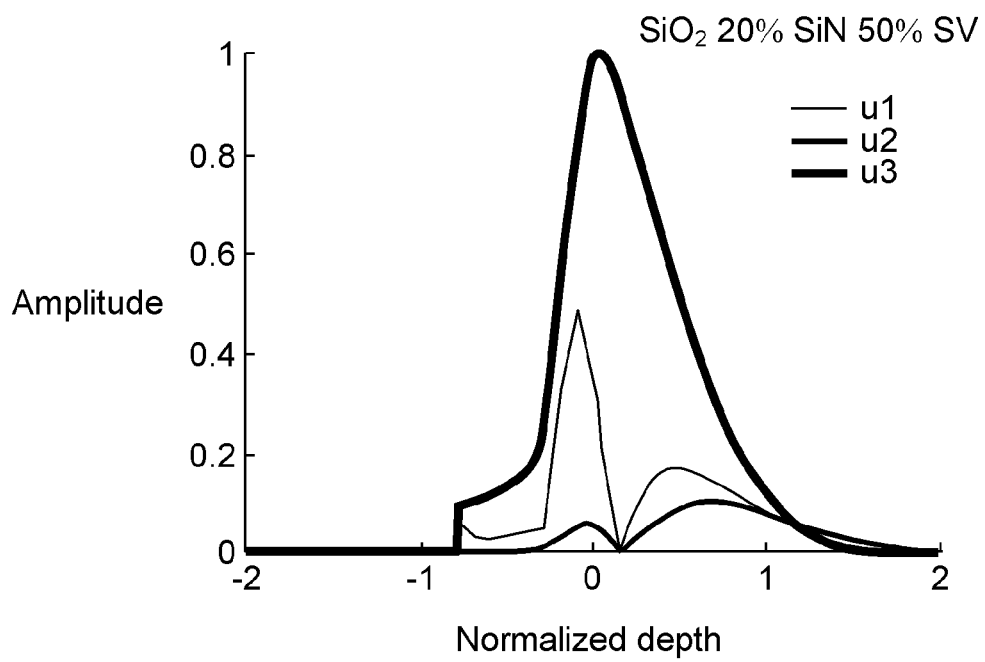
FIG. 5 is a graph showing displacement distribution of an SV wave of an elastic wave device (where, $H1/\lambda=0.2$, $H2/\lambda=0.5$) in accordance with the first exemplary embodiment.
Figure 6:
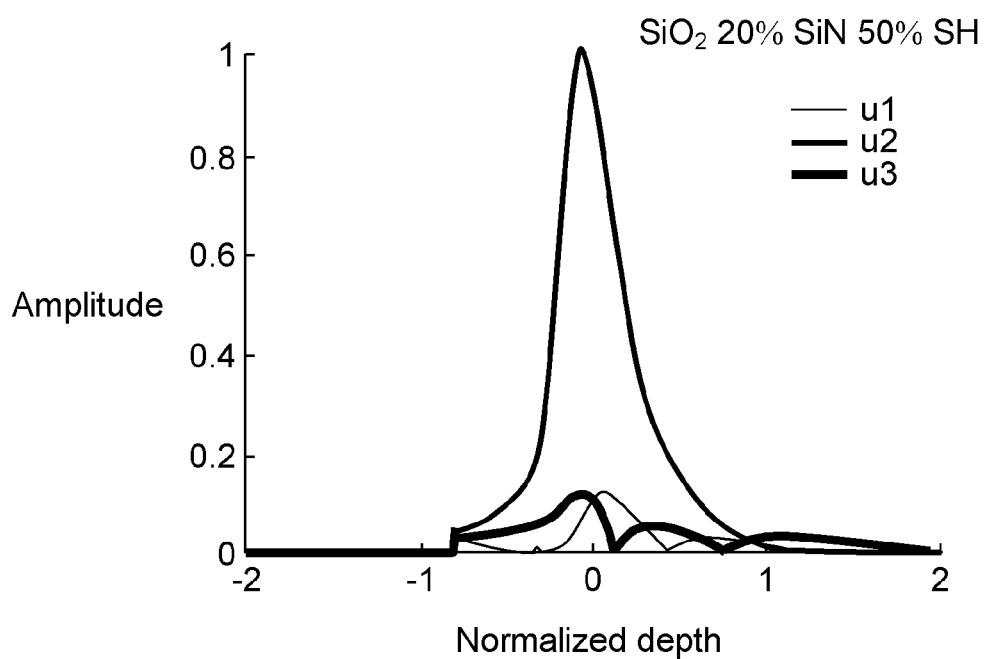
FIG. 6 is a graph showing displacement distribution of an SH wave of an elastic wave device (where, $H1/\lambda=0.2$, $H2/\lambda=0.5$) in accordance with the first exemplary embodiment.

FIG. 5 is a graph showing displacement distribution of an SV wave of an elastic wave device (where, H1/λ=0.2, H2/λ=0.5) in accordance with the first exemplary embodiment. FIG. 6 is a graph showing displacement distribution of an SH wave of the elastic wave device (where, H1/λ=0.2, H2/λ=0.5) in accordance with the first exemplary embodiment. As is apparent from FIGS. 5 and 6, the SV wave has a displacement distribution that extends to the surface of second dielectric layer 4; on the other hand, the SH wave has a very small displacement distribution at the surface of second dielectric layer 4.

Figure 7:
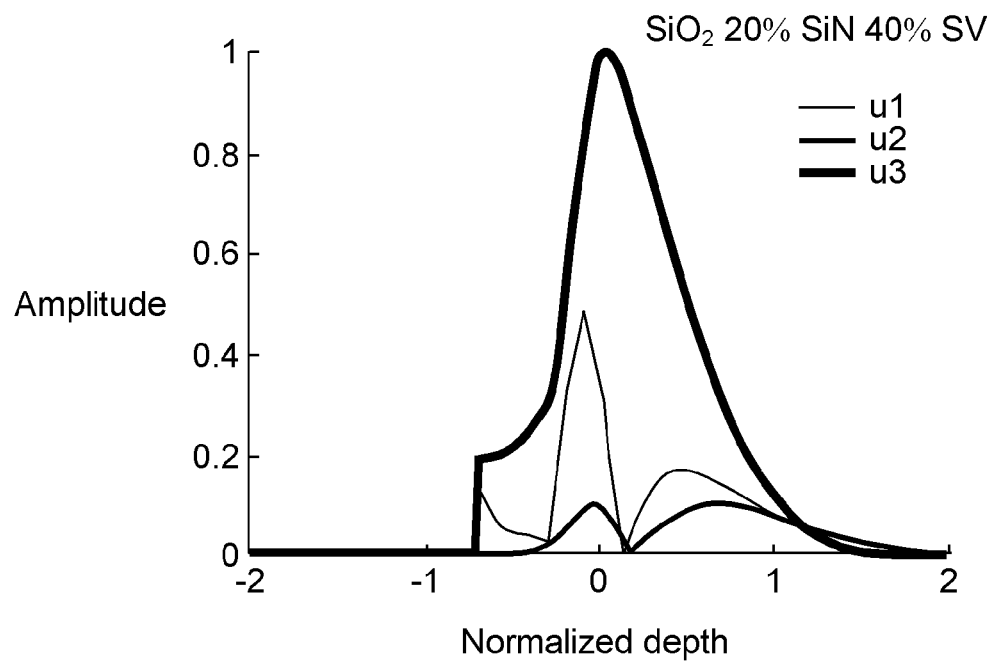
FIG. 7 is a graph showing displacement distribution of an SV wave of an elastic wave device (where, $H1/\lambda=0.2$, $H2/\lambda=0.4$) in accordance with the first exemplary embodiment.
Figure 8:
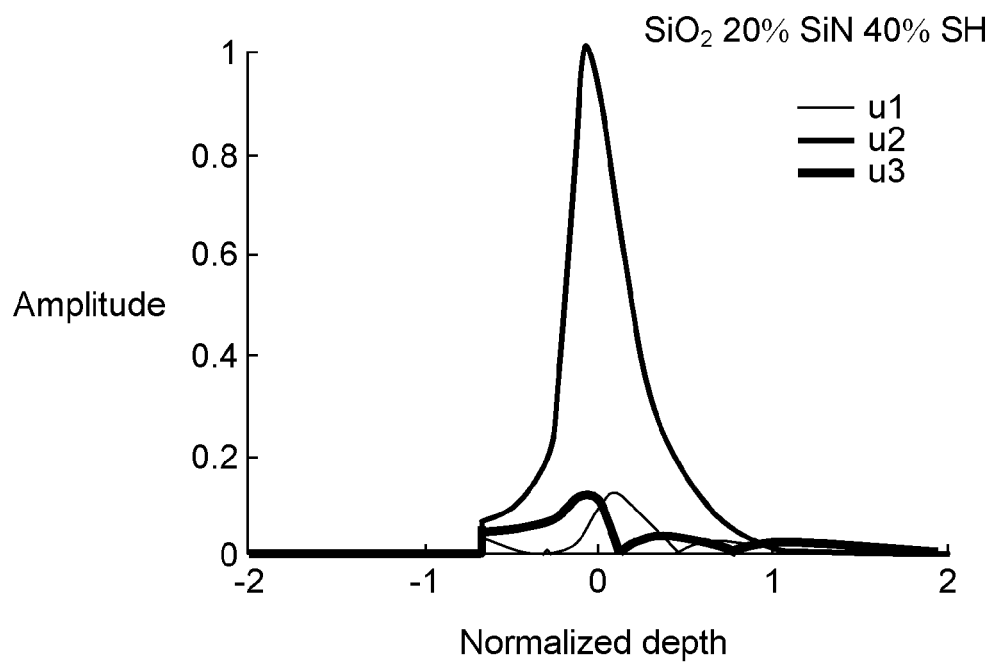
FIG. 8 is a graph showing displacement distribution of an SH wave of an elastic wave device (where, $H1/\lambda=0.2$, $H2/\lambda=0.4$) in accordance with the first exemplary embodiment.
Figure 9:
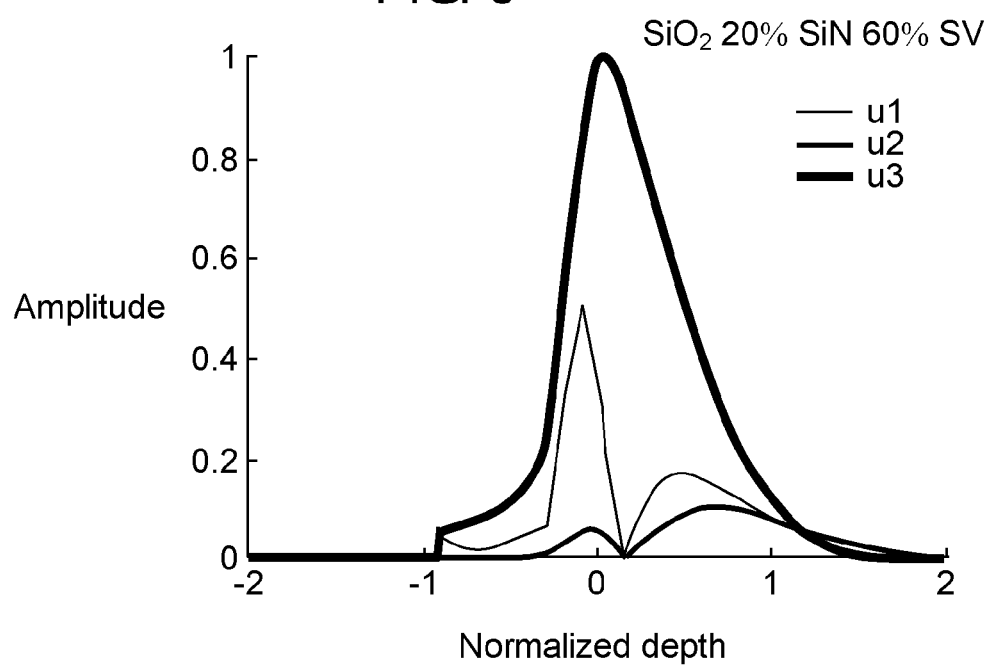
FIG. 9 is a graph showing displacement distribution of an SV wave of an elastic wave device (where, $H1/\lambda=0.2$, $H2/\lambda=0.6$) in accordance with the first exemplary embodiment.
Figure 10:
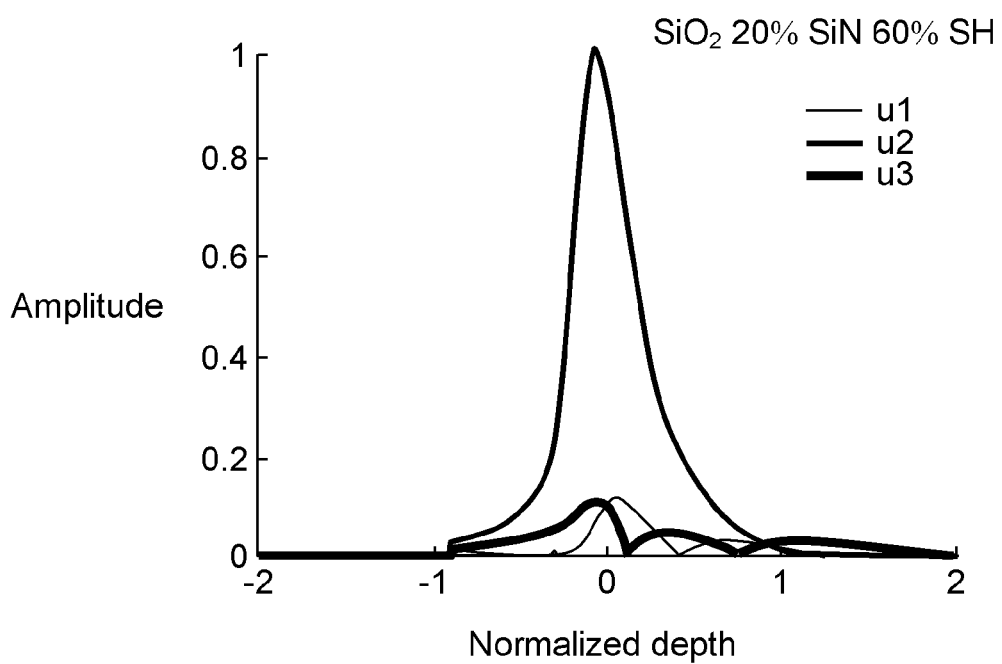
FIG. 10 is a graph showing displacement distribution of an SH wave (where, $H1/\lambda=0.2$, $H2/\lambda=0.6$) of an elastic wave device in accordance with the first exemplary embodiment.
Figure 11:
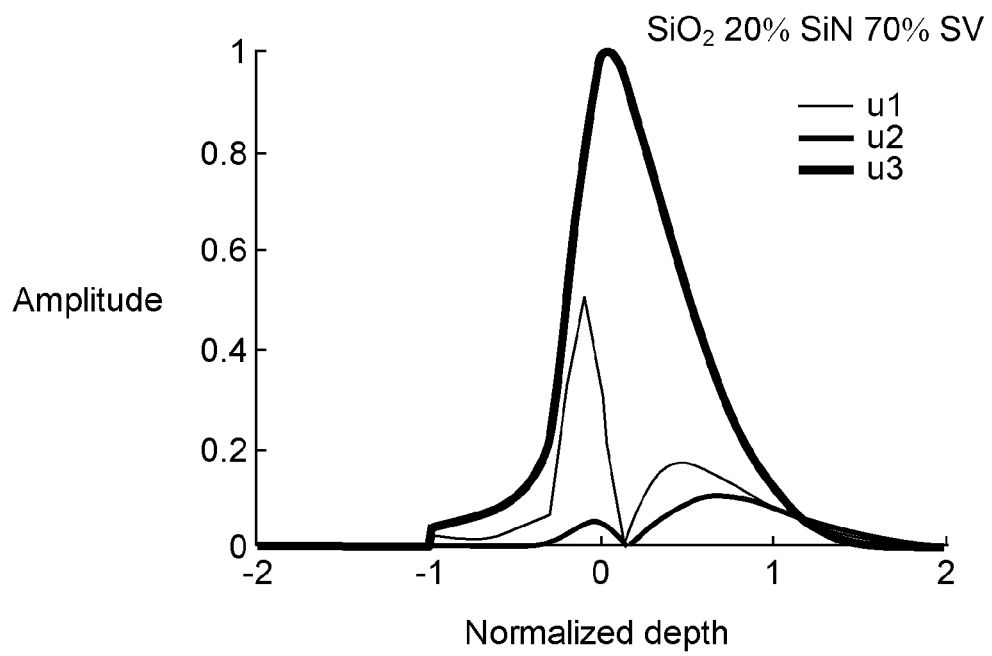
FIG. 11 is a graph showing displacement distribution of an SV wave of an elastic wave device (where, $H1/\lambda=0.2$, $H2/\lambda=0.7$) in accordance with the first exemplary embodiment.
Figure 12:
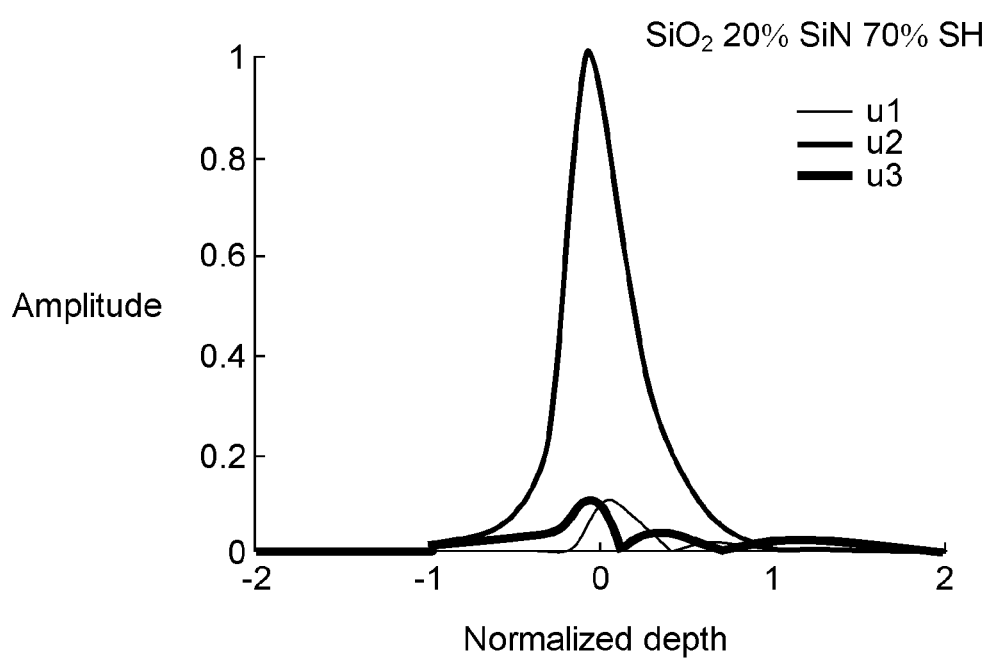
FIG. 12 is a graph showing displacement distribution of an SH wave of an elastic wave device (where, $H1/\lambda=0.2$, $H2/\lambda=0.7$) in accordance with the first exemplary embodiment.

FIG. 7 is a graph showing displacement distribution of an SV wave of an elastic wave device (where, H1/λ=0.2, H1/λ=0.4) in accordance with the first exemplary embodiment. FIG. 8 is a graph showing displacement distribution of an SH wave of an elastic wave device (where, H1/λ=0.2, H2/λ=0.4) in accordance with the first exemplary embodiment. FIG. 9 is a graph showing displacement distribution of an SV wave of an elastic wave device (where, H1/λ=0.2, H2/λ=0.6) in accordance with the first exemplary embodiment. FIG. 10 is a graph showing displacement distribution of an SH wave (where, H1/λ=0.2, H2/λ=0.6) of an elastic wave device in accordance with the first exemplary embodiment. FIG. 11 is a graph showing displacement distribution of an SV wave of an elastic wave device (where, H1/λ=0.2, H2/λ=0.7) in accordance with the first exemplary embodiment. FIG. 12 is a graph showing displacement distribution of an SH wave of an elastic wave device (where, H1/λ0.2, H2/λ=0.7) in accordance with the first exemplary embodiment.

In FIG. 7 through FIG. 12, when second dielectric layer 4 has a film thickness that satisfies H2/λ<0.4, the displacement distribution of the SH wave (i.e., the main wave) is found on the surface of second dielectric layer 4. Besides, applying an acoustical layer to the structure inconveniently attenuates the main wave. On the other hand, when second dielectric layer 4 has a film thickness that satisfies H2/λ>0.7, the displacement distribution of the SV wave (i.e., the unwanted wave) becomes small on the surface of second dielectric layer 4, by which the acoustical layer has no effect on suppressing the unwanted wave.

Considering above, determining the film thickness of second dielectric layer 4 so as to satisfy 0.4<H2/λ<0.7 allows the elastic wave device to effectively suppress the unwanted wave with very little attenuation of the main wave.

Figure 13:
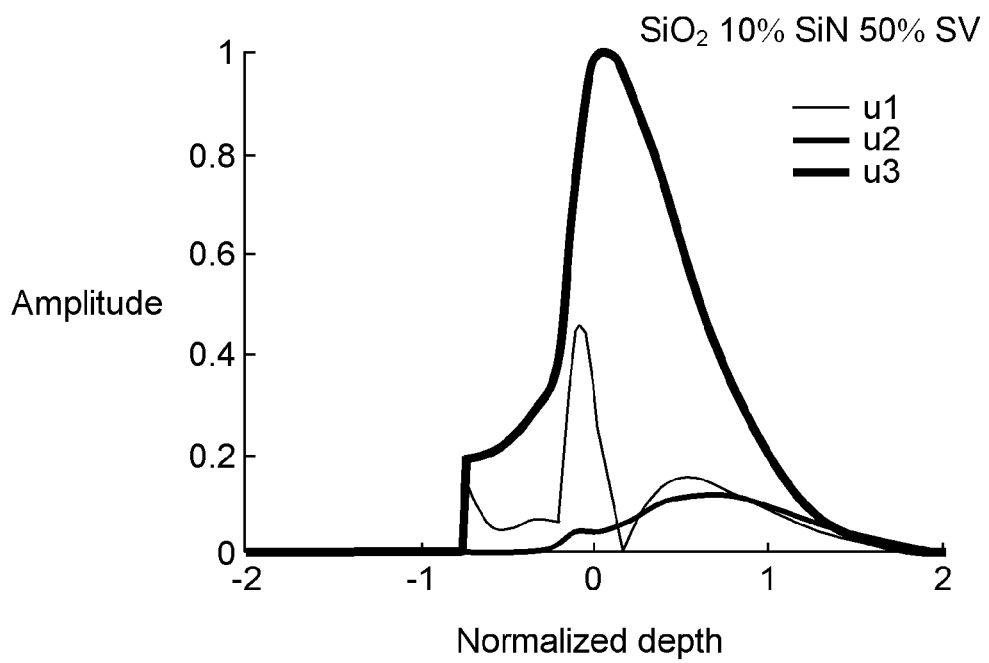
FIG. 13 is a graph showing displacement distribution of an SV wave of an elastic wave device (where, $H1/\lambda=0.1$, $H2/\lambda=0.5$) in accordance with the first exemplary embodiment.
Figure 14:
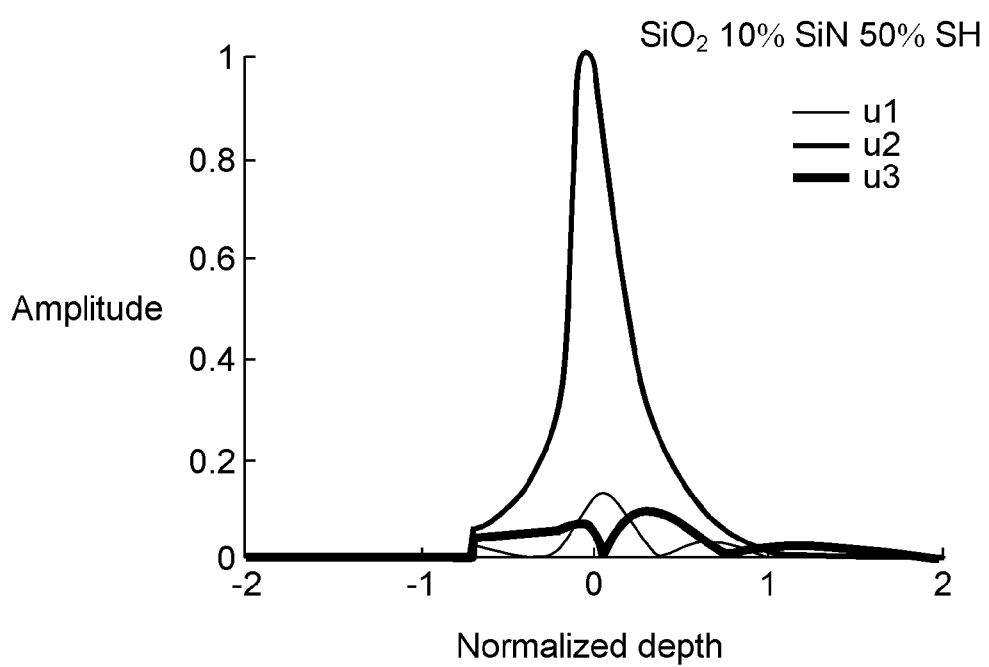
FIG. 14 is a graph showing displacement distribution of an SH wave of an elastic wave device (where, $H1/\lambda=0.1$, $H2/\lambda=0.5$) in accordance with the first exemplary embodiment.
Figure 15:
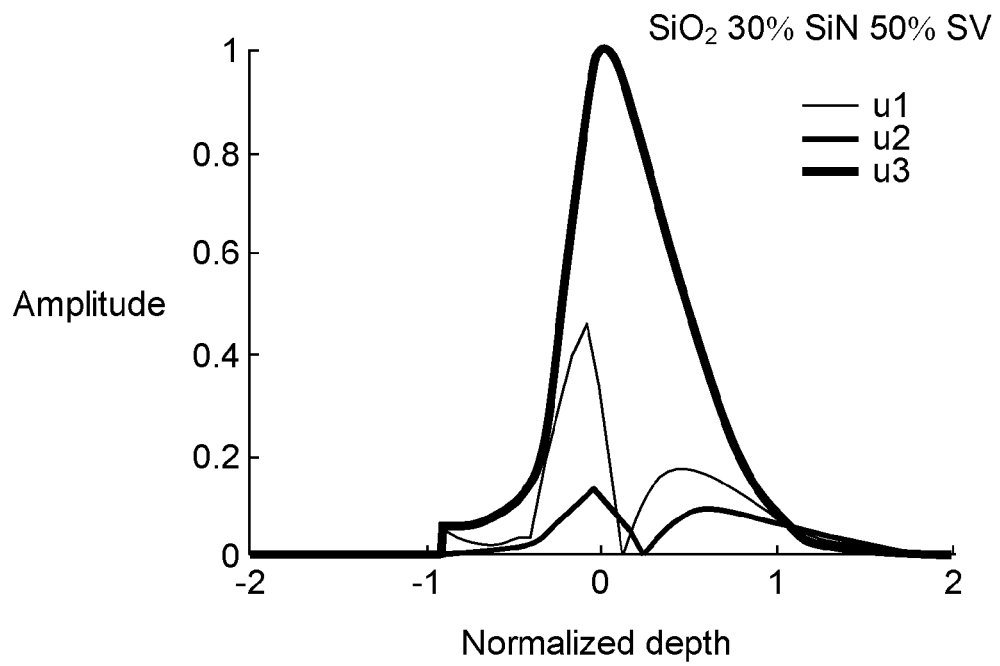
FIG. 15 is a graph showing displacement distribution of an SV wave of an elastic wave device (where, $H1/\lambda=0.3$, $H2/\lambda=0.5$) in accordance with the first exemplary embodiment.
Figure 16:
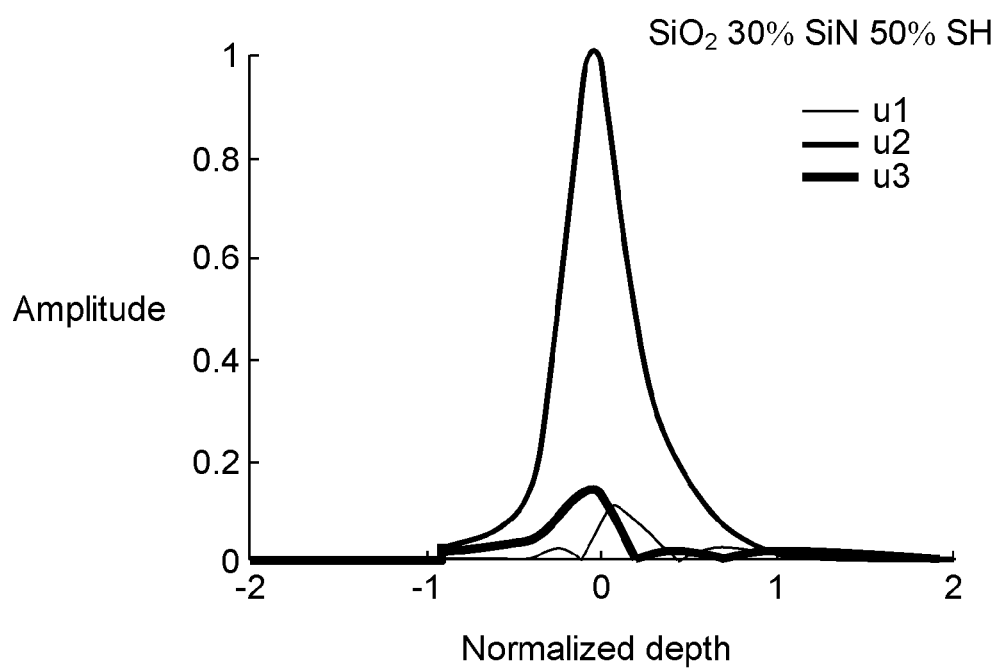
FIG. 16 is a graph showing displacement distribution of an SH wave of an elastic wave device (where, $H1/\lambda=0.3$, $H2/\lambda=0.5$) in accordance with the first exemplary embodiment.
Figure 17:
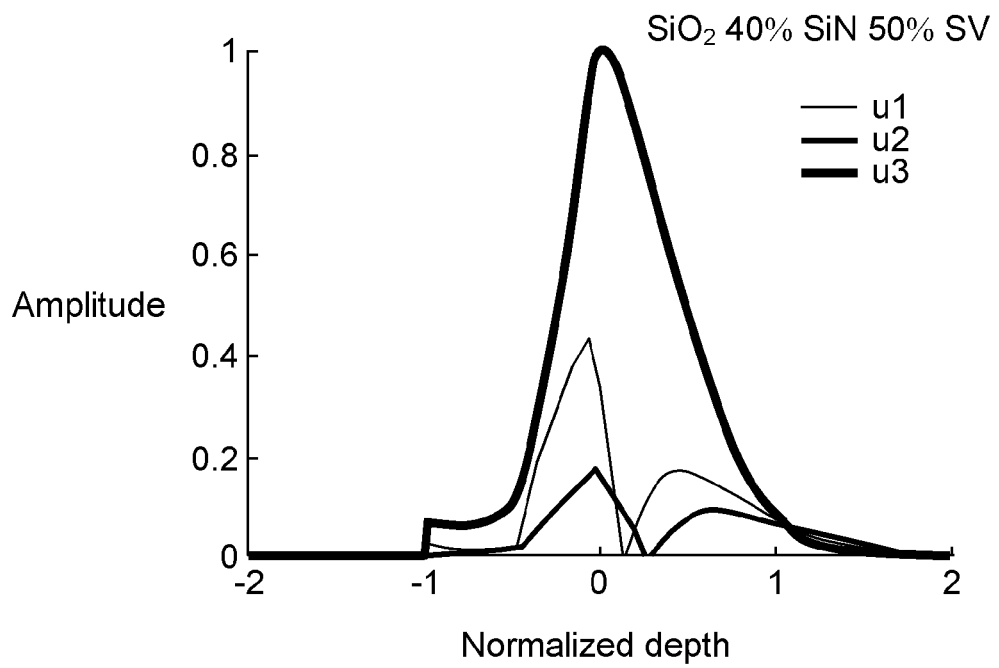
FIG. 17 is a graph showing displacement distribution of an SV wave of an elastic wave device (where, $H1/\lambda=0.4$, $H2/\lambda=0.5$) in accordance with the first exemplary embodiment.
Figure 18:
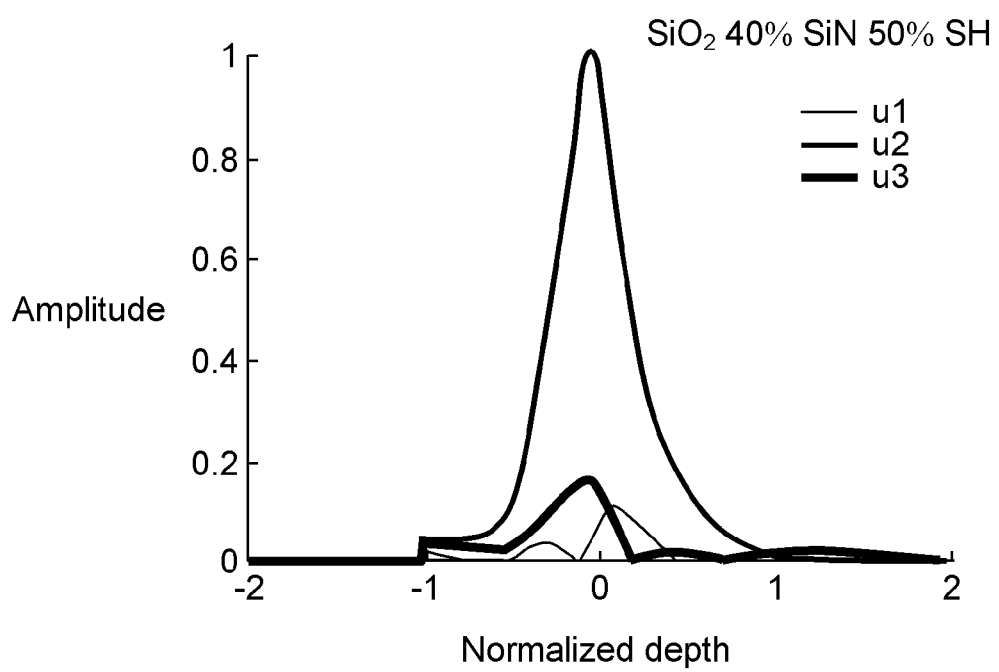
FIG. 18 is a graph showing displacement distribution of an SH wave of an elastic wave device (where, $H1/\lambda=0.4$, $H2/\lambda=0.5$) in accordance with the first exemplary embodiment.

FIG. 13 is a graph showing displacement distribution of an SV wave of an elastic wave device (where, H1/λ=0.1, H2/λ=0.5) in accordance with the first exemplary embodiment. FIG. 14 is a graph showing displacement distribution of an SH wave of an elastic wave device (where, H1/λ=0.1, H2/λ=0.5) in accordance with the first exemplary embodiment. FIG. 15 is a graph showing displacement distribution of an SV wave of an elastic wave device (where, H1/λ=0.3, H2/λ=0.5) in accordance with the first exemplary embodiment. FIG. 16 is a graph showing displacement distribution of an SH wave of an elastic wave device (where, H1/λ=0.3, H2/λ=0.5) in accordance with the first exemplary embodiment. FIG. 17 is a graph showing displacement distribution of an SV wave of an elastic wave device (where, H1/λ=0.4, H2/λ=0.5) in accordance with the first exemplary embodiment. FIG. 18 is a graph showing displacement distribution of an SH wave of an elastic wave device (where, H1/λ=0.4, H2/λ=0.5) in accordance with the first exemplary embodiment.

In FIG. 13 through FIG. 18, when first dielectric layer 2 has a film thickness that satisfies H1/λ<0.1, the displacement distribution of the SH wave is also found on the surface of second dielectric layer 4. Therefore, applying an acoustical layer to the structure inconveniently attenuates the main wave. On the other hand, when first dielectric layer 2 has a film thickness that satisfies H1/λ>0.3, the displacement distribution of the SV wave (i.e., the unwanted wave) becomes small on the surface of second dielectric layer 4, by which the acoustical layer has no effect on suppressing the unwanted wave.

Considering above, determining the film thickness of first dielectric layer 2 so as to satisfy 0.1<H1/λ<0.3 allows the elastic wave device to effectively suppress the unwanted wave with very little attenuation of the main wave.

Figure 19:
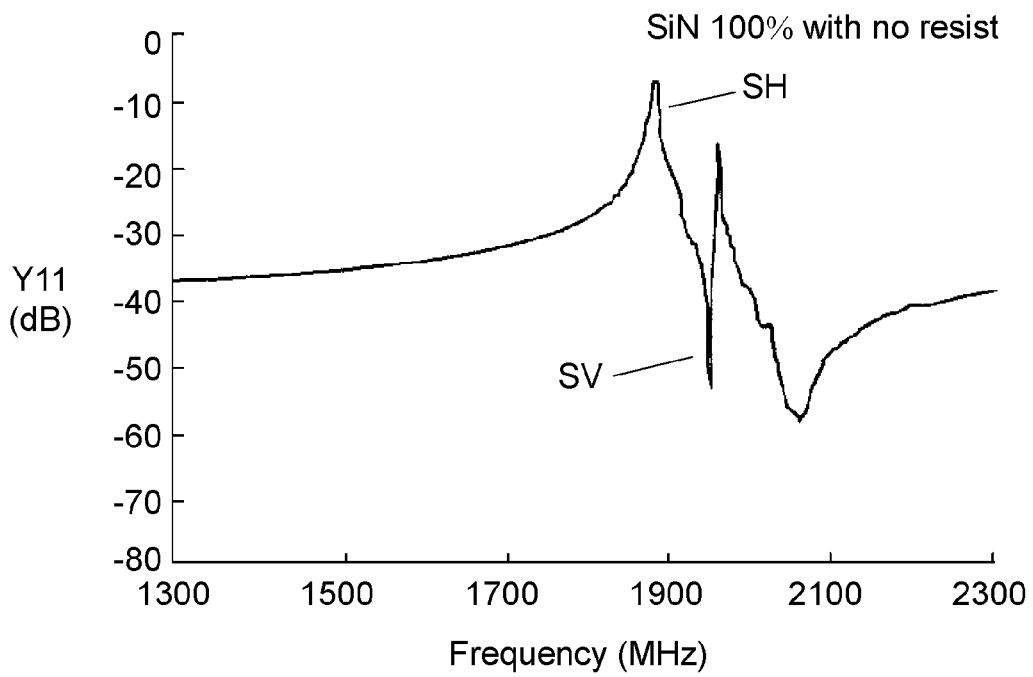
FIG. 19 is a graph showing admittance characteristics of a resonator with no acoustical layer of an elastic wave device (where, $H1/\lambda=0.2$, $H2/\lambda=1.0$) in accordance with the first exemplary embodiment.
Figure 20:
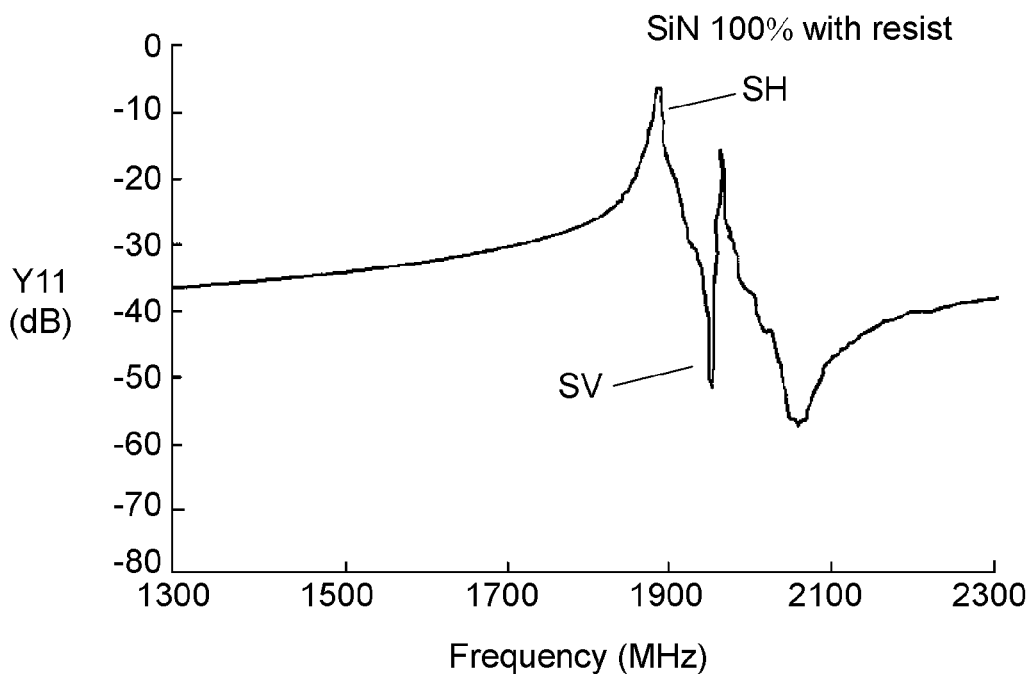
FIG. 20 is a graph showing admittance characteristics of a resonator having an acoustical layer of an elastic wave device (where, $H1/\lambda=0.2$, $H2/\lambda1.0$) in accordance with the first exemplary embodiment.
Figure 21:
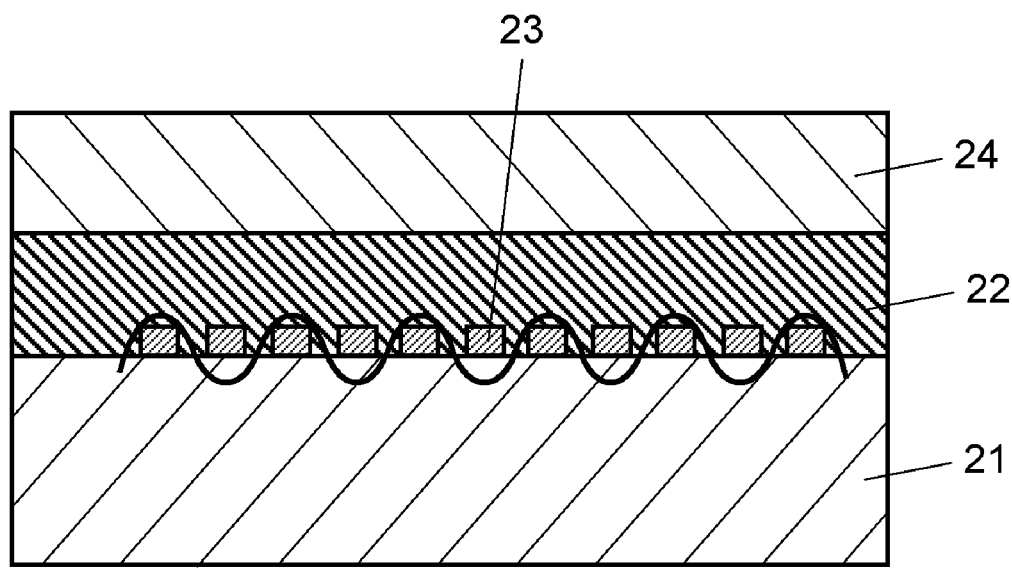
FIG. 21 is a sectional view of a conventional elastic boundary wave device.

FIG. 19 is a graph showing admittance characteristics of a resonator with no acoustical layer of an elastic wave device (where, H1/λ=0.2, H2/λ=1.0) in accordance with the first exemplary embodiment. FIG. 20 is a graph showing admittance characteristics of a resonator having an acoustical layer of an elastic wave device (where, H1/λ=0.2, H2/λ=1.0) in accordance with the first exemplary embodiment. As is in the structure with no acoustical layer in FIG. 19, the structure of FIG. 20 has no effect of suppressing the SV wave despite of having the acoustical layer. That is, proper selection of the film thickness of first dielectric layer 2 and second dielectric layer 4 allows the acoustical layer to have an effect of suppressing the SV wave.

The elastic wave device of the present invention effectively suppresses the extraneous response of the SV wave. Employing the elastic wave device of the present invention provides a cut angle of Y-cut with a coupling coefficient higher than a case with no use of the elastic wave device, offering a filter and a duplexer workable on a wide frequency band and suppressing insertion loss. In particular, a structure having a coupling coefficient higher than 0.15, preferably than 0.2 contributes to an enhanced performance of a duplexer for Band 1, Band 4 and Band 10 with a wide interval between transmitting and receiving in Universal Mobile Telecommunications System (UMTS). Further, employing piezoelectric substrate 1 with a cut angle of Y-cut of −5 degrees or greater and smaller than 10 degrees offers a high coupling coefficient.

Besides, forming a resonator in which an elastic wave propagates in the X-axis direction or in a direction having a range of ±5 degrees with respect to the X-axis is effective in suppressing propagation loss caused by power flow. As further advantage, silicon oxide has an effect of compensating temperature characteristics; employing silicon oxide for an elastic wave substrate improves temperature characteristics of the elastic wave device.

The elastic wave device of the present invention suppresses an extraneous response occurred in filter bandwidth, offering excellent characteristics with low losses. The elastic wave device is therefore useful for various types of electronic equipment, such as mobile phones.

What is claimed is:

1. An elastic wave device comprising:
    a piezoelectric substrate;
    an IDT electrode disposed on an upper side of the piezoelectric substrate;
    a first dielectric layer made of silicon oxide and disposed on an upper side of the IDT electrode;
    a second dielectric layer made of silicon nitride or aluminum nitride and disposed on an upper side of the first dielectric layer; and
    an acoustical layer disposed on an upper side of the second dielectric layer,
    wherein the second dielectric layer has a film thickness in a range of 0.4λ to 0.7λ, where λ represents a wavelength at an operation center frequency of an elastic wave in the piezoelectric substrate, and
    wherein the piezoelectric substrate is a Y-cut LiNbO$_3$ substrate with a cut angle ranging from −10 degrees to +30 degrees in which an elastic wave propagates in an X-axis direction or in a direction having a range of ±5 degrees with respect to the X axis.

2. The elastic wave device of claim 1, wherein the first dielectric layer has a film thickness in a range of 0.1λ to 0.3λ.

3. The elastic wave device of claim 1, wherein the IDT electrode is made of Cu.

4. A filter comprising the elastic wave device of claim 1.

5. Electronic equipment comprising the elastic wave device of claim 1.

* * * * *